United States Patent [19]
Yaguchi

[11] Patent Number: 5,432,794
[45] Date of Patent: Jul. 11, 1995

[54] AUTOMATIC EQUALIZER

[75] Inventor: Tatsuya Yaguchi, Yokohama, Japan

[73] Assignee: Canon Kabushiki Kaisha, Tokyo, Japan

[21] Appl. No.: 268,725

[22] Filed: Jun. 30, 1994

Related U.S. Application Data

[63] Continuation of Ser. No. 827,165, Jan. 28, 1992, abandoned.

[30] Foreign Application Priority Data

Jan. 29, 1991 [JP] Japan ................. 3-009248
Jan. 29, 1991 [JP] Japan ................. 3-009249

[51] Int. Cl.⁶ .................. G06F 11/00; H03H 7/30
[52] U.S. Cl. ................... 371/5.5; 375/230
[58] Field of Search ............. 371/5.5, 5.1; 375/10, 375/11, 12, 13, 14

[56] References Cited

U.S. PATENT DOCUMENTS

| | | | |
|---|---|---|---|
| 4,438,521 | 3/1984 | Mattei | 375/16 |
| 4,759,036 | 7/1988 | Meyers | 375/14 |
| 4,809,298 | 2/1989 | Sakare et al. | 375/17 |
| 4,852,166 | 7/1989 | Masson | 380/36 |
| 4,928,287 | 5/1990 | Tanaka | 375/13 |
| 4,979,211 | 12/1990 | Bevenuto et al. | 381/43 |
| 4,995,057 | 2/1991 | Chung | 375/13 |
| 5,036,525 | 7/1991 | Wong | 375/14 |
| 5,111,481 | 5/1992 | Chen et al. | 375/14 |

Primary Examiner—Robert W. Beausoliel, Jr.
Assistant Examiner—Joseph E. Palys
Attorney, Agent, or Firm—Fitzpatrick, Cella, Harper & Scinto

[57] ABSTRACT

An adaptive type automatic equalizer is provided with a mean square error detection circuit including a square circuit 119 for squaring the absolute value of an equalization error, and a low-pass filter 120. A comparator 102 compares the detection value of the detection circuit with a predetermined threshold value λ. When the detection value is larger than the threshold value, the type of the adaptive type automatic equalizer is switched from normal equalization to blind equalization. Even when the adaptive type automatic equalizer diverges, it can be controlled to converge again. When a level change amount detector 101 for detecting a level change amount received from a line at an input point detects a level change exceeding a predetermined level, a timer A 119 measures the duration time of the level change. When the measured duration exceeds a predetermined period of time, the timer switches a switch 124 to shift an equalization mode from normal equalization to blind equalization. The blind equalization processing time is measured by a timer B 120. When the blind equalization processing time reaches a predetermined period of time, the switch 124 is switched again to shift the equalization mode from blind equalization to normal equalization.

33 Claims, 5 Drawing Sheets

AUTOMATIC EQUALIZER

This application is a continuation of application Ser. No. 017/827,165 filed Jan. 28, 1992, now abandoned.

BACKGROUND OF THE INVENTION

1. Field of the Invention

The present invention relates to an automatic equalizer in a modulator/demodulator for performing data transmission by utilizing a line.

2. Description of the Prior Art

When digital signal data is transmitted through a general public line (analog line), a modulator/demodulator (modem) for converting a digital signal into a desired analog signal, and vice versa is required. The modulator/demodulator normally includes an adaptive type automatic equalizer for correcting line characteristics. Prior to data transmission, the modulator/demodulator transmits a training signal to confirm, e.g., transmission characteristics of the line, and adjusts equalization characteristics of the equalizer, thus determining correction specifications of transmission characteristics defined by, e.g., the line characteristics. Thereafter, equalization processing according to the correction specifications is executed, so that the equalizer characteristics are changed to follow a slow change in line characteristics over time during data transmission. Such equalization processing is normally called automatic equalization or adaptive equalization.

FIG. 5 shows an arrangement of a conventional adaptive type automatic equalizer. FIG. 5 exemplifies a case wherein the equalizer comprises a transversal filter.

In FIG. 5, reference numeral 200 denotes a demodulator for converting a modulated signal received from a line into a complex baseband signal. Subsequently, the complex baseband signal from the modulator 200 is supplied to a complex conjugator 203, and is then converted into a complex conjugate baseband signal. The complex conjugate baseband signal is sequentially input to a delay circuit 204 constituting a transversal filter. The delay circuit 204 delays a complex by a predetermined period of time.

In FIG. 5, $[(C_{-N})^{r+1}, \ldots, (C_0)^{r+1}, \ldots, (C_N)^{r+1}]$ represent tap gains to be multiplied with outputs from delay circuit circuits located immediately thereabove by multipliers 205. Reference numeral 207 denotes an adder for calculating a total sum of products of the delayed complex conjugate baseband signal, and the tap gains.

An equalizer output signal $Y_k$ of a conventional equalizer constituted by the complex conjugator 203, the delay circuit 204, the multipliers 205, and the adder 207 is given by:

$$Y_k = \sum_{(i=-N)}^{N} (C_i)^{r+1} \cdot (R_{k-i})^* \qquad (1)$$

where * represents complex conjugate, and $(R_{k-i})^*$ is the ith complex conjugate baseband signal to the equalizer. $(C_i)^{r+1}$ is the value calculated in an $(r+1)$th calculation of an ith tap gain of the transversal filter.

The equalizer output $Y_k$ given by equation (1) is input to a discriminator 210. The discriminator 210 has a plurality of reference signal points. The discriminator 210 selects a point having the shortest distance to $Y_k$ as a discrimination point of $Y_k$ from these reference signal points, and outputs it as a point a. Note that a difference $E_k = Y_k - a_k$ between the equalizer output $Y_k$ and the discrimination point $a_k$ corresponds to an equalization error at time k.

In this manner, the conventional adaptive type automatic equalizer is a circuit for sequentially correcting tap gains $[C_{-N} \ldots C_0 \ldots C_N]$ so as to minimize the mean square error of E. Each tap gain of the conventional adaptive type automatic equalizer is updated according to the following equation:

$$(Ci)^{r+1} = (Ci)^r - \alpha \cdot (R_{k-1})^* \cdot E_k \qquad (2)$$

where $\alpha$ is a constant that influences an equalization rate of the adaptive type automatic equalizer, and is generally called a convergence coefficient.

A circuit for updating the tap gains given by equation (2) is constituted by the delay circuits 204 located immediately below the tap gains (FIG. 5), the multipliers 205, adders 206, and a switch 209. Note that the switch 209 outputs the convergence coefficient $\alpha$.

When data transmission is performed using the modulator/demodulator provided with the above-mentioned adaptive type automatic equalizer, if a line is instantaneously disconnected or suffers from an abrupt level drift, equalization processing is assumed to be adaptively performed according to the tap gain correction algorithm given by equation (2). In this case, the equalization error $E_k$ assumes a very large value, and the tap gains unexpectedly change largely.

As a result, equalization performance of the adaptive type automatic equalizer is immediately impaired. Thereafter, discrimination errors successively occur, or when the degree of the line trouble is serious, the equalizer diverges, and its equalization performance may never be recovered.

A conventional countermeasure against impaired equalization performance or divergence of the adaptive type automatic equalizer due to the above-mentioned line trouble will be explained below.

In FIG. 5, a modulated signal received from the line is subjected to level adjustment by AGC (automatic gain control) having a time constant, which is large enough not to be influenced by the amplitude drift inherent to the modulated signal, before the signal is input to the demodulator 200. The level-adjusted modulated signal received from the line is demodulated into a complex baseband signal by the demodulator 200. For this reason, when the complex baseband signal from the demodulator 200 is input to a detector 201 that detects the amount of change in the level of the signal (hereinafter the "level change amount detector 201"), only the amount of change in the level corresponding to an instantaneous disconnection or an abrupt level drift, which cannot be level-adjusted by the AGC prior to the demodulator 200, is detected. The detected amount of change in the level is compared with a comparison value $\beta$ selected in advance by a comparator 202. If the amount of change in the level is larger than the value $\beta$, the switch 209 outputs a convergence coefficient "0"; otherwise, the switch 209 outputs the convergence coefficient $\alpha$. Note that the comparison value $\beta$ is a constant determined within a range of the amount of change in the level wherein no discrimination error occurs.

The above description can be rephrased as follows.

When the line is instantaneously disconnected or suffers from an abrupt level drift, and the comparator 202 determines that it is not preferable to correct the tap gains of the adaptive type automatic equalizer due to the line abnormality, the switch 209 selects the convergence coefficient $\alpha = 0$. For this reason, equation (2) for updating the tap gains is rewritten as $(C_1)^{r+1} = (C_1)^r$, thereby freezing the tap gains On the other hand, when the line abnormality is recovered, the switch 209 selects the convergence coefficient $\alpha$, and the updating operation of the tap gains based on equation (2) is restarted, so that the adaptive type automatic equalizer can start sequential line equalization.

However, in the above-mentioned prior art, when a line abnormality such as an instantaneous disconnection or an abrupt level drift is detected, since the updating operation of the tap gains of the adaptive type automatic equalizer is frozen, line characteristics may drift over time, or synchronization of timing phases or carrier phases may be considerably shifted when the line abnormality is detected for a long period of time.

Under such circumstances, even if the line abnormality is recovered, and the updating operation of the tap gains is restarted, the equalization error is large, and as a result, discrimination errors frequently occur, resulting in divergence of the adaptive type automatic equalizer.

SUMMARY OF THE INVENTION

The present invention has been made to solve the above-mentioned drawbacks, and has as its object to provide an automatic equalizer, which can converge even after it diverges.

As means for achieving the above object, an automatic equalizer of the present invention comprises, e.g., the following arrangement.

More specifically, an automatic equalizer of the present invention comprises averaging means for averaging an amount associated with a magnitude of an equalization error signal as a difference between a transversal filter output and a discriminator output, comparison means for comparing an averaged level by the averaging means with a predetermined threshold value level, and equalization means for performing blind equalization when the comparison means determines that the averaged level is equal to or larger than the predetermined threshold level, and performing normal equalization when the comparison means determines that the averaged level is equal to or smaller than the predetermined threshold level.

Alternatively, an automatic equalizer comprises equalization means capable of selectively executing normal equalization processing and blind equalization processing, detection means for detecting an amount of change in the level received from a line at an input point of the equalization means, first measurement means for measuring a duration of a level change exceeding a predetermined level of the detection means, first shift means for, when the duration measured by the first measurement means exceeds a predetermined period of time, shifting an equalization mode of the equalization means from normal equalization to blind equalization, second measurement means for measuring a blind equalization processing time by the equalization means, and second shift means for, when the second measurement means measures a predetermined blind equalization processing time, shifting the equalization mode of the equalization means from the blind equalization to the normal equalization.

With the above arrangement, when the automatic equalizer diverges, it can be controlled to converge again.

Other features and advantages of the present invention will be apparent from the following description taken in conjunction with the accompanying drawings, in which like reference characters designate the same or similar parts throughout the figures thereof.

DETAILED DESCRIPTION OF THE PREFERRED EMBODIMENTS

The preferred embodiments of the present invention will be described hereinafter.

[First Embodiment]

Figure 1:
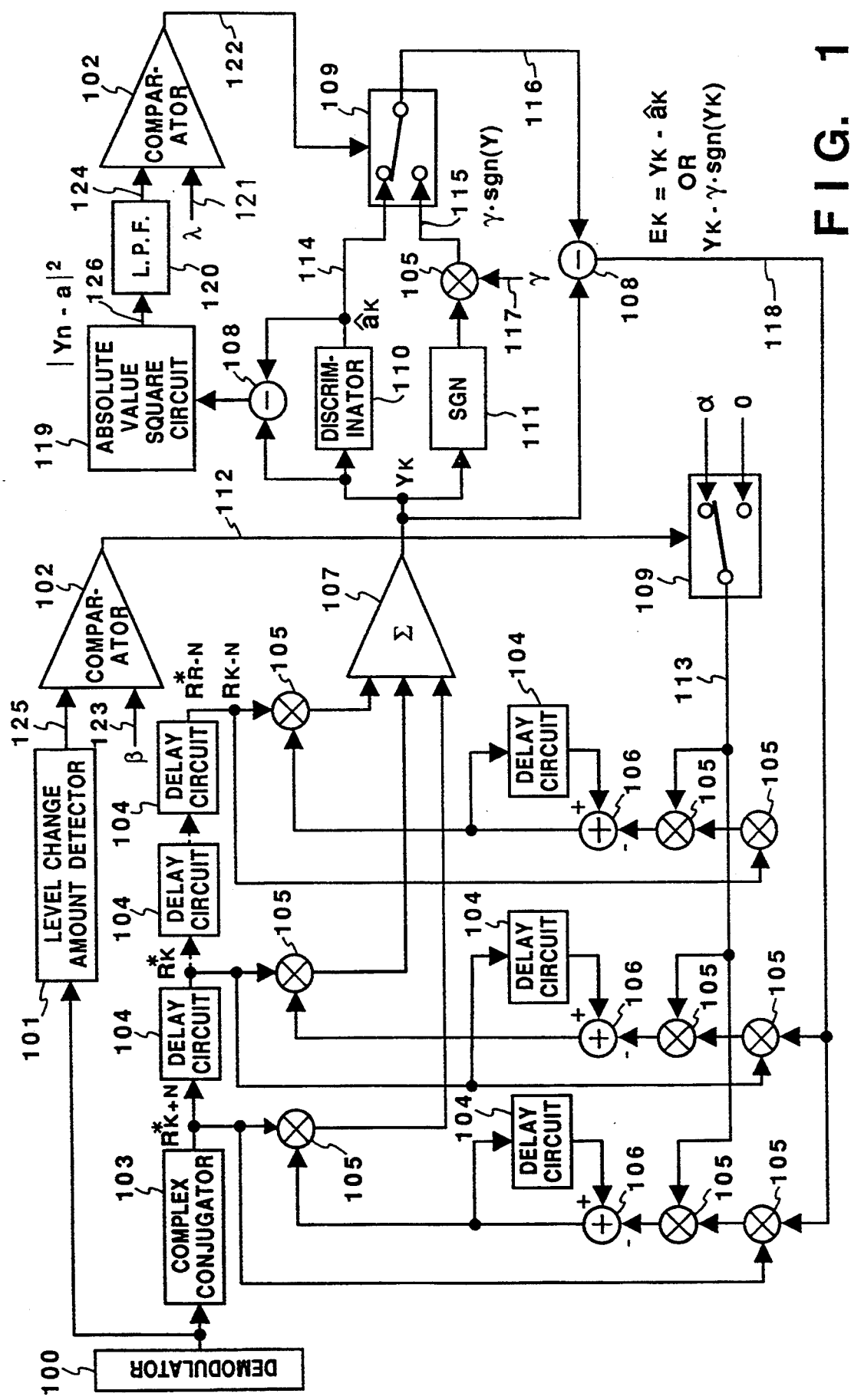
FIG. 1 is a block diagram of an adaptive type automatic equalizer according to the first embodiment of the present invention.
Figure 5:
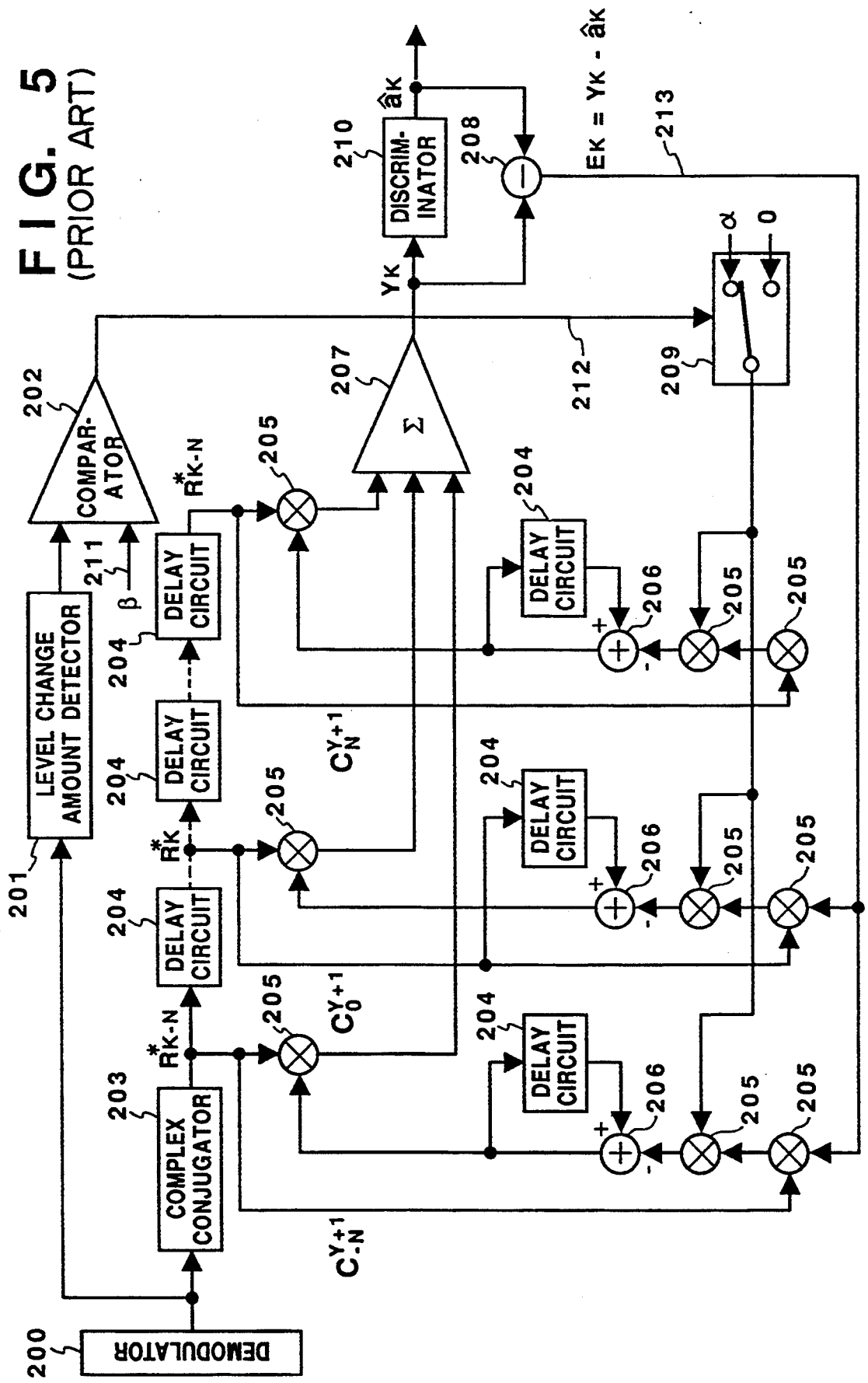
FIG. 5 is a block diagram showing a conventional adaptive type automatic equalizer.

FIG. 1 is a block diagram of the first embodiment according to the present invention. In FIG. 1, the arrangement for performing processing before an adder 107, the arrangement of a demodulator 100, the arrangements of a transversal filter and a tap gain updating circuit of an adaptive type automatic equalizer, and a method of switching a convergence coefficient upon detection of a level change are the same as the arrangement for performing processing before the adder 207, the arrangement of the demodulator 200, and the method of switching the convergence coefficient upon detection of a level change in FIG. 5, and a detailed description thereof will be omitted.

A circuit for realizing a tap gain updating algorithm necessary for blind equalization as an arrangement unique to this embodiment shown in FIG. 1 will be described in detail below.

An equalizer output $Y_k$ as an output from the adder 107 is input to a discriminator 110, and is also input to a sign extraction circuit (SGN) 111 in this embodiment. The sign extraction circuit 111 outputs a signal sgn $(Y_k)$, i.e., or "+1" or "−1". The signal sgn$(Y_k)$ from the sign extraction circuit 111 is multiplied with a constant $\gamma$ by a multiplier 105. Therefore, when a switch 109 selects a signal line 115, $\gamma \cdot \mathrm{sgn}(Y_k)$ is output from the switch 109 to a signal line 116.

For this reason, $Y_k - \gamma \cdot \mathrm{sgn}(Y_k)$ is output from a subtracter 108, and in a blind equalization mode, the tap gains of the adaptive type automatic equalizer are updated according to the following equation:

$$(C_1)^{r+1} = (C_1)^4 - \alpha \cdot (R_{k-1})^* \cdot \{Y_k - \gamma \cdot \mathrm{sgn}(Y_k)\} \qquad (3)$$

where $\gamma$ is a constant equal to or smaller than 1.

In this embodiment, the equalizer output $Y_k$ from the adder 107 is input to the discriminator 110. The discriminator 110 outputs a discrimination point $a_k$ of $Y_k$, and the absolute value of an equalization error $E_k = Y_k - a_k$ is input to a square circuit 119.

The absolute value square circuit 119 calculates the absolute value of a complex equalization error signal, and squares the absolute value. The circuit 119 outputs $|E_k|^2 = |Y_k - a_k|^2$.

The output $|E_k|^2 = |Y_k - a_k|^2$ from the absolute value square circuit 119 is input to a low-pass filter 120, and is averaged. The output mean value from the low-pass filter 120 is supplied to a comparator 102, and is then compared with a predetermined constant $\lambda$. As a result of comparison, when the mean square error is larger than the constant $\lambda$, it is determined that the equalization characteristics of the adaptive type automatic equalizer are not good. Thus, control is made in such a manner that the switch 109 selects a signal from the signal line 115 as an output from the multiplier 105, and outputs it onto the signal line 116.

Contrary to this, as a result of comparison, when the mean square error is smaller than the constant $\lambda$, and when the constant $\lambda$ is larger than the mean square error, it is determined that line equalization performance is good. Thus, control is made in such a manner that the switch 109 selects a signal from a signal line 114 as an output from the discriminator 110, and outputs it onto the signal line 116.

As a result, in the adaptive type automatic equalizer of this embodiment, when the signal line 114 is selected by the switch 109, normal equalization processing for updating the tap gains based on equation (2) described above is executed. When the signal line 115 is selected by the switch 109, blind equalization processing is executed.

Figure 2:
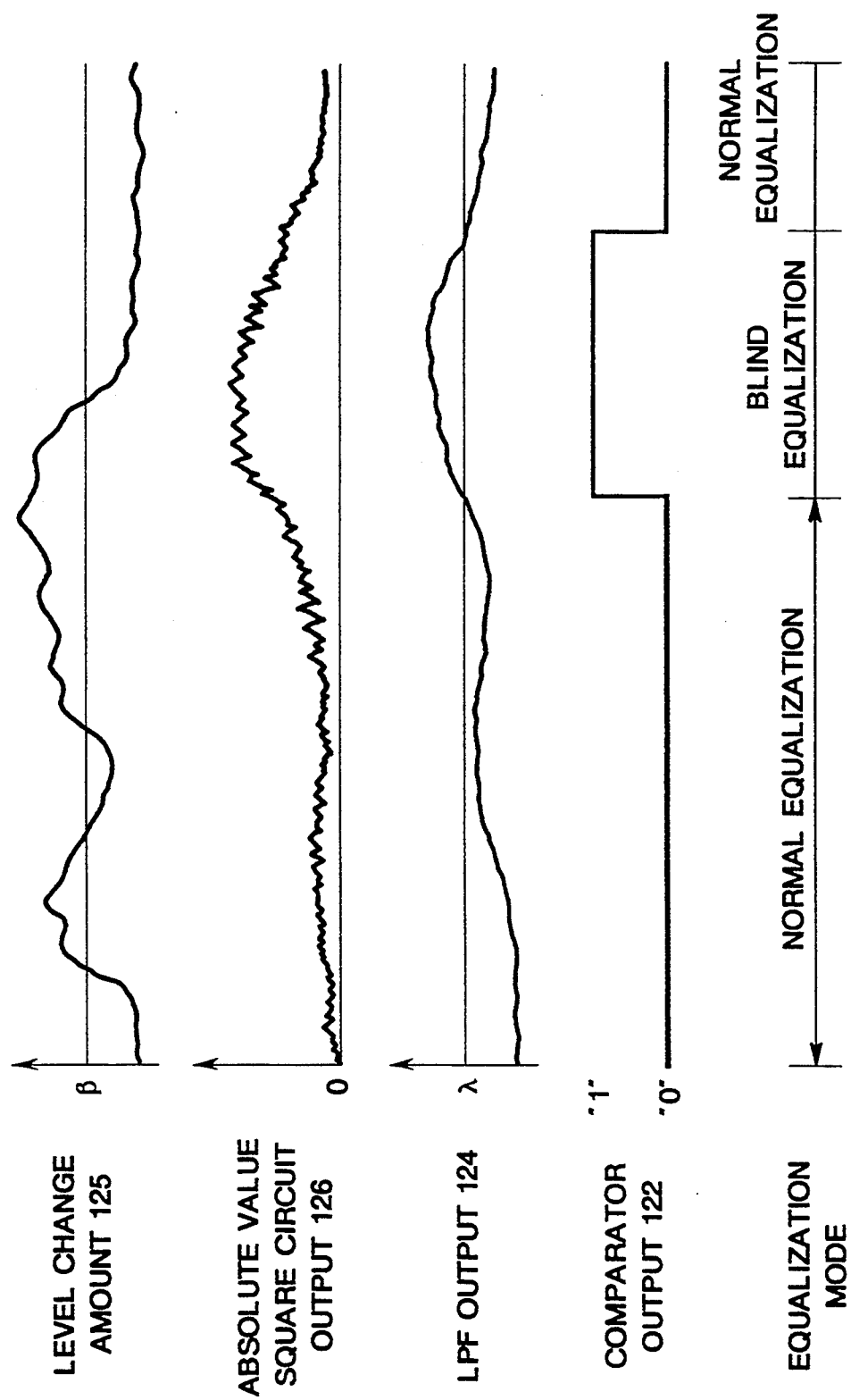
FIG. 2 is a timing chart showing signal waveforms in respective sections of the first embodiment.

FIG. 2 shows signal waveforms of the respective sections shown in FIG. 1.

As shown in FIG. 2, when an amount of change in the level 125 is increased beyond a comparison value $\beta$, an absolute value square circuit output 126 is increased accordingly. A low-pass filter output 124 is obtained by averaging the absolute value square circuit output. When the output 124 exceeds $\lambda$, a comparator output 122 changes from "0" to "1", and the adaptive type automatic equalizer shifts its equalization mode from the normal equalization mode to the blind equalization mode.

Thereafter, as a result of continuous execution of the blind equalization, the square circuit output value of the absolute value of the equalization error signal is decreased, and the low-pass filter output value 124 is decreased to be smaller than $\lambda$ accordingly. Thus, the comparator output 122 changes from "1" to "0", and the adaptive type automatic equalizer restores its equalization mode from the blind equalization mode to the normal equalization mode based on an LMS (root mean square) method.

As described above, according to this embodiment, when a line abnormality such as instantaneous disconnection, impulse noise, abrupt level drift, or the like continues for a long period of time, or occurs frequently, the equalization error may be increased, and as a result, the adaptive type automatic equalization may diverge. In such a case, the equalization mode can be switched between the blind equalization mode and the normal equalization mode with reference to the mean square value, and the equalizer can be controlled to converge again.

As described above, according to the present invention, when a line trouble such as instantaneous disconnection or abrupt level drift occurs, and as a result, the automatic equalizer diverges, the equalization mode can be switched from the normal equalization mode to the blind equalization mode, so that the equalizer can be controlled to converge again.

[Second Embodiment]

Figure 3:
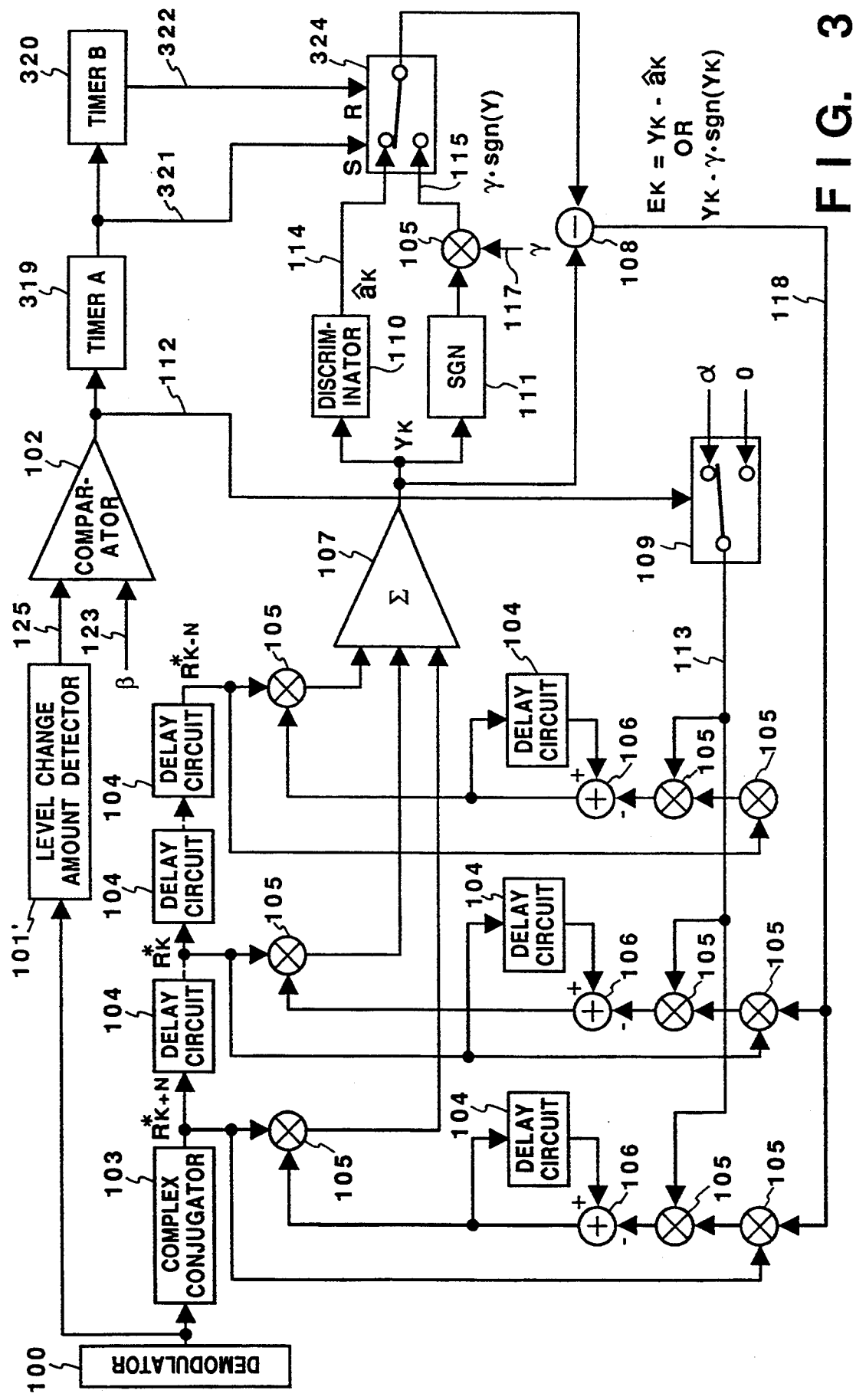
FIG. 3 is a block diagram of an adaptive type automatic equalizer according to the second embodiment of the present invention.

FIG. 3 is a block diagram showing the second embodiment of the present invention. The same reference numerals in FIG. 3 denote the same parts as in FIG. 1, and a detailed description thereof will be omitted.

A circuit for realizing, e.g., a switching operation between normal equalization and blind equalization as an arrangement unique to the second embodiment shown in FIG. 3 will be described in detail below.

In this embodiment, when a line is instantaneously disconnected or suffers from an abrupt level drift, and when a level drift that causes an amount of change in the level detected by a level change amount detector 101 to exceed a comparison threshold value $\beta$ of a comparator 102 occurs due to such line abnormality, the comparator 102 outputs an output 112. The output 112 from the comparator 102 controls a switch 109, and is also input to a timer A 319.

For this reason, when a level drift that causes an amount of change in the level detected by the level change amount detector 101 to exceed the comparison threshold value $\beta$ of the comparator 102 occurs, the timer A 319 is started, and measures a duration of the instantaneous disconnection or the abrupt level drift. The timer A 319 restarts the measurement of the duration every time the value of the level change amount detector 101 due to the instantaneous disconnection or abrupt level drift is decreased below the comparison value $\beta$.

When the instantaneous disconnection or abrupt level drift continues for a predetermined period of time or longer, the timer A 319 outputs a control signal onto a control line 321, thus controlling a switch 324 to select a set side, i.e., a signal line 115 through the control line 321.

At the same time, the timer A 319 starts a timer B 320 so as to enable blind equalization for a predetermined period of time. After an elapse of the predetermined period of time, the timer B 320 controls the switch 324 to select a reset side, i.e., a signal line 114 through a control line 322.

When the signal line 114 is selected by the switch 324, the adaptive type automatic equalizer executes normal equalization processing for updating tap gains based on equation (2) described above. When the signal line 115 is selected, the equalizer executes the same blind equalization processing as that in the above-mentioned first embodiment.

Figure 4:
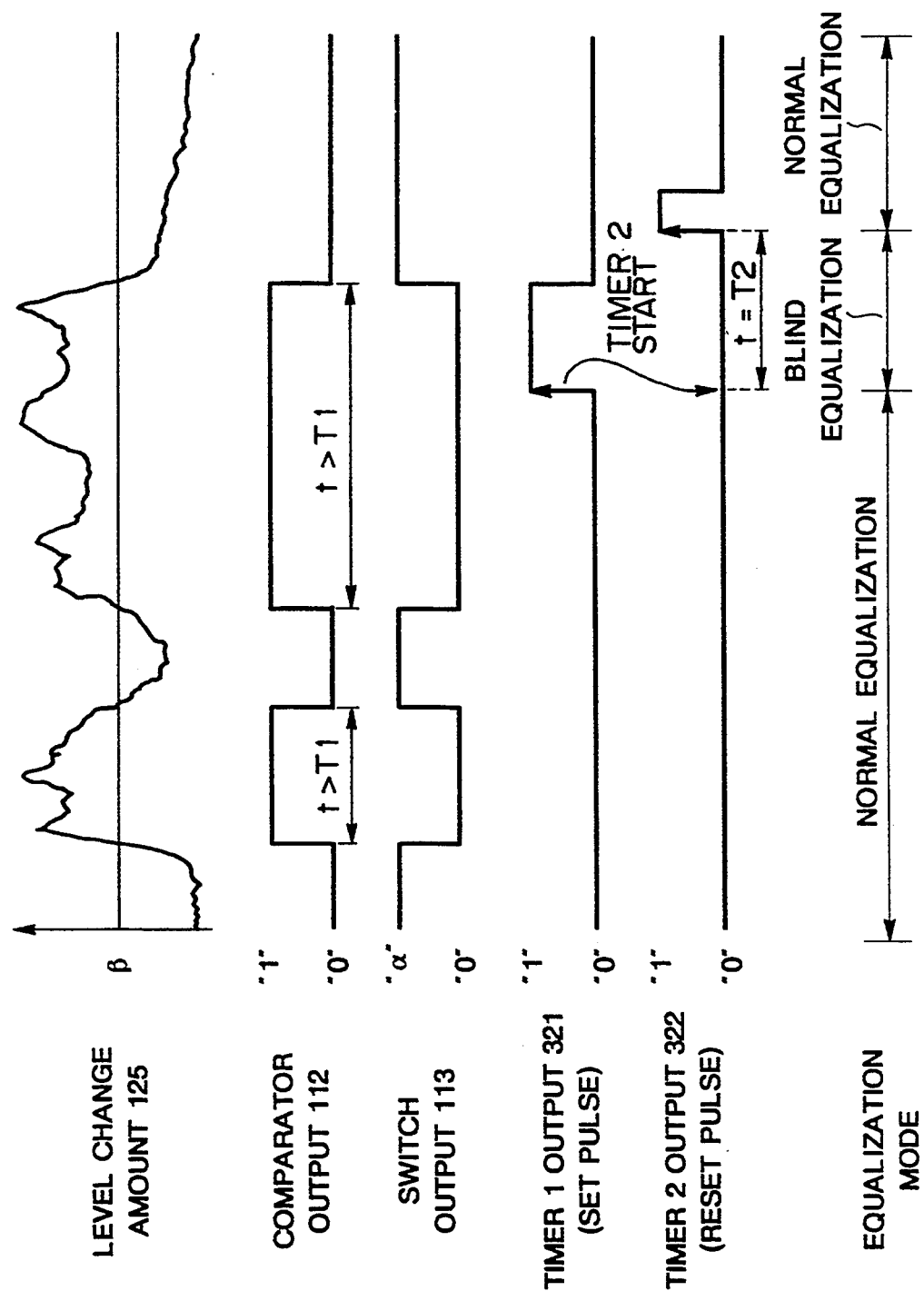
FIG. 4 is a timing chart showing signal waveforms in respective sections of the second embodiment.

Note that FIG. 4 shows signal waveforms of the respective sections of FIG. 3.

As shown in FIG. 4, even when an amount of change in the level 125 exceeds the comparison value $\beta$, the equalization mode cannot be switched from a normal equalization mode based on the LMS method to a blind equalization mode unless this state continues for a time T1 as a setting time of the timer A 319.

When the amount of change in the level 125 continuously exceeds the comparison value $\beta$ over the time T1, the timer A 319 starts the timer B 320, and at the same time, controls the switch 324 to select the signal line 115. Thus, the adaptive type automatic equalization shifts its equalization mode from the normal equalization mode to the blind equalization mode.

The blind equalization processing is continuously executed for a setting time T2 of the timer B 320. Thereafter, the switch 324 is reset by the timer B 320 through the control line 322. Thus, the adaptive type automatic equalizer restores its equalization mode from the blind equalization mode to the normal equalization mode.

As described above, according to the second embodiment, even when a line abnormality such as instantaneous disconnection, impulse noise, abrupt level drift, or the like occurs, the two equalization modes, i.e., the blind equalization mode and the normal equalization mode are selectively used according to the line abnormality duration. Thus, even when the adaptive type automatic equalizer diverges due to a line abnormality which continues for a long period of time, it can be controlled to converge again.

Another Embodiment

In the above embodiment, as a measure for determining a divergence state of the adaptive type automatic equalizer, the square error is used. However, the present invention is not limited to this. For example, the absolute value of the difference between an equalizer output and a discrimination point may be used, and the same effect as described above may be easily attained.

In the above embodiment, as a means for averaging the square error, a low-pass filter is used. Alternatively, the same effect as described above may be attained by using another circuit for smoothing a signal by, e.g., moving average, additive mean, or the like.

In the above embodiment, as the blind equalization method, a currently popular algorithm is employed. However, the present invention is not limited to the above-mentioned algorithm, and any other algorithms may be adopted as long as blind equalization can be performed.

Similarly, in this embodiment, as the normal equalization method, a currently popular tap gain updating algorithm based on a render method is employed. However, the present invention is not limited to the above-mentioned algorithm, and any other algorithms may be adopted as long as normal equalization can be performed.

Furthermore, in the above embodiment, normal equalization and blind equalization use the common convergence coefficient α. However, separate convergence coefficients may be used so as to optimize the corresponding equalization methods, as a matter of course.

Various other changes and modifications may be made within the spirit and scope of the invention.

As described above, the adaptive type automatic equalizer according to the present invention can provide the following effect with the above-mentioned arrangement.

Since the adaptive type automatic equalizer of the present invention always monitors the duration of a line abnormality such as instantaneous disconnection or abrupt level drift, even when the line abnormality continues for a long period of time, and as a result, the adaptive type automatic equalizer diverges, the equalization mode can be switched from a normal equalization mode to a blind equalization mode, thus causing the equalizer to converge again.

As many apparently widely different embodiments of the present invention can be made without departing from the spirit and scope thereof, it is to be understood that the invention is not limited to the specific embodiments thereof except as defined in the appended claims.

What is claimed is:

1. An automatic equalizer comprising:
   equalization means;
   comparison means for comparing an equalization error of said equalization means with a predetermined threshold value;
   detecting means for detecting a sign of an equalized output of said equalization means;
   selection means for selecting either an equalization error of said equalization means or the sign of the equalized output detected by said detecting means according to a comparison result of said comparison means; and
   updating means for updating an equalizing characteristic of said equalization means based on whichever one of the equalization error and the sign of the equalized output is selected.

2. The equalizer according to claim 1, wherein said equalization means comprises a transversal filter and a discriminator.

3. The equalizer according to claim 2, wherein said comparison means has averaging means for averaging a difference between an output from said transversal filter and an output from said discriminator, and compares a mean level with the predetermined threshold value.

4. The equalizer according to claim 3, wherein said averaging means averages an amount associated with a magnitude of the equalization error by calculating an absolute value of the equalization error, squaring the absolute value, and then passing the square value through a low-pass filter.

5. The equalizer according to claim 1, wherein said updating means updates the equalization characteristic based on a difference between the equalized output and the selected sign of the equalized output multiplied by a coefficient.

6. The equalizer according to claim 1, wherein said selecting means selects the equalization error when the equalization error is smaller than the predetermined threshold value, while the selection means selects the sign of the equalized output when the equalization error is larger than the predetermined threshold value.

7. An automatic equalizer comprising:
   equalization means for selectively executing normal equalization processing and blind equalization processing;
   detection means for detecting an amount of change in the level of a received signal from a line at an input point of said equalization means;
   first measurement means for measuring a duration during which the amount of change in the level of the received signal detected by said detection means exceeds a predetermined level;
   first shift means for, in response to the duration measured by said first measurement means reaching a predetermined period of time, shifting an equalization mode of said equalization means from a normal equalization mode to a blind equalization mode;
   second measurement means for measuring a blind equalization processing time during which said equalization means executes blind equalization processing in response to said first shift means; and
   second shift means for, in response to the blind equalization time measured by said second measurement means reaching a predetermined blind equalization processing time, shifting the equalization mode of said equalization means from the blind equalization mode to the normal equalization mode.

8. The equalizer according to claim 7, wherein said equalization means selectively executes normal equalization and blind equalization by changing a tap gain updating equation.

9. The equalizer according to claim 7, wherein said first measurement means comprises a timer circuit for outputting a control signal after an elapse of said predetermined period of time starting when said timer circuit starts its time measurement, said timer circuit starting its time measurement when said detection means detects that the amount of change in the level of the received signal exceeds the predetermined level, and said timer circuit thereafter stopping and initializing its time measurement in response to said detection means detecting that the amount of change in the level of the received signal has returned to being not more than the predetermined level, said timer circuit restarting its time measurement from zero when said detection means again detects that the amount of change in the level of the received signal exceeds the predetermined level.

10. The equalizer according to claim 7, wherein said second measurement means comprises a timer circuit, which is started in response to a control signal output in response to said first measurement means measuring the duration as reaching the predetermined period of time.

11. The equalizer according to claim 7, wherein said first and second shift means comprise switch circuits for shifting the equalization mode from the normal equalization mode to the blind equalization mode in response to a control signal from said first measurement means, and for shifting the equalization mode from the blind equalization mode to the normal equalization mode in response to a control signal from said second measurement means.

12. The equalizer according to claim 7, wherein the normal equalization processing is based on an LMS method.

13. The equalizer according to claim 7, wherein said equalization means executes the normal equalization processing based on an equalization error, and the blind equalization processing based on a sign of an equalized output.

14. The equalizer according to claim 7, wherein the equalization means executes the blind processing based on a difference between the equalized output and the selected sign of the equalized output multiplied by a coefficient.

15. The equalizer according to claim 7, wherein said equalization means comprises a transversal filter.

16. An equalizer comprising:
    equalization means;
    comparison means for comparing an equalization error of said equalization means with a predetermined threshold value;
    selecting means for selecting either an equalization error of said equalization means or a sign of an equalized output of said equalization means according to a comparison result from said comparison means, so that when the equalization error is smaller than the predetermined threshold value, the equalization error is selected, and when the equalization error is larger than the predetermined threshold value, the sign of the equalized output is selected; and
    updating means for updating an equalization characteristic of said equalization means, based on whichever one of the equalization error and the sign of the equalized result is selected.

17. The equalizer according to claim 16, wherein said updating means updates the equalization characteristic based on a difference between the equalized output and the selected sign of the equalized output multiplied by a coefficient.

18. The equalizer according to claim 16, wherein said equalization means comprises a transversal filter.

19. The equalizer according to claim 16, further comprising discriminating means for discriminating reception data from the equalized output, and obtaining means for obtaining the equalization error and the reception data.

20. A receiving method for receiving a signal, comprising the steps of:
    receiving a signal from a line;
    equalizing the received signal to provide an equalized signal;
    detecting a sign of the equalized signal provided in the equalizing step;
    selecting either an equalization error produced in the equalizing step or the sign of the equalized signal detected in the detecting step according to a magnitude of the equalization error; and
    updating an equalizing characteristic in said equalizing step, based on whichever one of the equalization error and the sign of the equalized signal is selected.

21. The receiving method according to claim 20, wherein in said selecting step, the equalization error is selected when the equalization error is smaller than a predetermined value, and the sign of the equalized signal is selected when the equalization error is larger than the predetermined threshold value.

22. The receiving method according to claim 20, wherein, in said updating step, the equalizing characteristic is updated based on a difference between the equalized signal and the selected sign of the equalized signal multiplied by a coefficient.

23. The receiving method according to claim 20, further comprising a discriminating step for discriminating reception data from the equalized signal, and an obtaining step for obtaining the equalization error from the equalized signal and the reception data.

24. A receiving method for receiving a signal, comprising the steps of:
    receiving a signal from a lines the signal having an instantaneous level;
    detecting an amount of change in the level of the received signal from a reference level;
    equalizing the received signal to provide an equalized signal;
    detecting a sign of the equalized signal;
    selecting either an equalization error or the detected sign of the equalized signal according to the detected amount of change in the level of the received signal; and
    updating an equalizing characteristic in said equalizing steps based on whichever one of the equalization error and the sign of the equalized signal is selected.

25. The receiving method according to claim 24, wherein the reference level is a predetermined threshold value and wherein in said selecting step, the sign of the equalized signal is selected when the amount of change in the level of the received signal is larger than the predetermined threshold value.

26. The receiving method according to claim 24, wherein in said updating step, the equalizing characteristic is updated based on a difference between the equalized signal and the selected sign of the equalized signal multiplied by a coefficient.

27. The receiving method according to claim 24, wherein the reference level is a predetermined threshold value and wherein in said selecting step, the sign of the equalized signal is selected when the amount of change in the level of the received signal is larger than the predetermined threshold value for a predetermined time period.

28. The receiving method according to claim 24, wherein the reference level is a predetermined threshold value and wherein in said selecting step, the equalization error is selected when a predetermined time period has passed since the amount of change in the level of the received signal exceeded the predetermined threshold value.

29. A receiving method for receiving a signal, comprising the steps of:
   receiving a signal from a line;
   equalizing the received signal to provide an equalized signal;
   selecting either an equalization error produced in the equalizing step or a sign of the equalized signal provided in the equalizing step according to a reception state in the receiving step; and
   updating an equalizing characteristic in the equalizing step, based on whichever one of the sign of the equalized signal and the equalization error is selected.

30. The receiving method according to claim 29, wherein the selecting step selects either the equalization error or the sign of the equalized signal according to a magnitude of the equalization error.

31. The receiving method according to claim 29, wherein in said selecting steps the equalization error is selected when the equalization error is smaller than a predetermined threshold values and the sign of the equalized signal is selected when the equalization error is larger than the predetermined threshold value.

32. The receiving method according to claim 29, wherein in said updating steps the equalizing characteristic is updated based on a difference between the equalized signal and the sign of the equalized signal multiplied by a coefficient.

33. The receiving method according to claim 29, further comprising a discriminating step for discriminating reception data from the equalized signal, and an obtaining step for obtaining the equalization error from the equalized signal and the reception data.

* * * * *

UNITED STATES PATENT AND TRADEMARK OFFICE
CERTIFICATE OF CORRECTION

PATENT NO. : 5,432,794
DATED : July 11, 1995
INVENTOR(S) : TATSUYA YAGUCHI

It is certified that error appears in the above-identified patent and that said Letters Patent is hereby corrected as shown below:

COLUMN 1

Line 5, "No. 017/827,165" should read --No. 07/827,165--.

COLUMN 3

Line 8, "gains" should read --gains.--.
    Line 55, "level received" should read --level of the received signal--.

COLUMN 4

Equation (3), "$(C1)^4$" should read --$(C1)^r$--.

COLUMN 6

Line 63, "ßover" should read --ß over--.

COLUMN 10

Line 48, "lines" should read --line,--.
    Line 60, "steps" should read --step,--.

COLUMN 12

Line 12, "steps" should read --step,--.
    Line 14, "values" should read --value,--.

UNITED STATES PATENT AND TRADEMARK OFFICE
CERTIFICATE OF CORRECTION

PATENT NO. : 5,432,794
DATED : July 11, 1995
INVENTOR(S) : TATSUYA YAGUCHI

It is certified that error appears in the above-identified patent and that said Letters Patent is hereby corrected as shown below:

<u>COLUMN 12</u>

Line 18, "steps" should read --step,--.

Signed and Sealed this

Twenty-first Day of November, 1995

Attest:

BRUCE LEHMAN

*Attesting Officer*   *Commissioner of Patents and Trademarks*